United States Patent
Choi

(10) Patent No.: US 6,417,538 B1
(45) Date of Patent: Jul. 9, 2002

(54) NONVOLATIVE SEMICONDUCTOR MEMORY DEVICE WITH HIGH IMPURITY CONCENTRATION UNDER FIELD OXIDE LAYER

(75) Inventor: Jeong-hyuk Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/360,843

(22) Filed: Jul. 22, 1999

(30) Foreign Application Priority Data

Jul. 23, 1998 (KR) ............................................. 98-29734

(51) Int. Cl.[7] ............................................. H01L 29/788
(52) U.S. Cl. ........................ 257/315; 257/314; 257/316; 257/317; 257/324; 257/390; 257/399
(58) Field of Search ................................. 257/314–317, 257/321, 324, 325, 390, 519, 399, 400

(56) References Cited

U.S. PATENT DOCUMENTS 5,386,132 A * 1/1995 Wong ........................... 257/316
5,879,990 A * 3/1999 Dormans et al. ........... 257/316
6,030,868 A * 2/2000 Early et al. .................. 438/257

OTHER PUBLICATIONS

Tomoharu Tanaka et al., "A 4–Bit NAND–EEPROM With Tight Programmed Vt Distribution", 1990 Symposium on VLSI Circuits, 1990 IEEE, pp. 105–106.

* cited by examiner

Primary Examiner—Minh Loan Tran
(74) Attorney, Agent, or Firm—Marger Johnson & McCollom, P.C.

(57) ABSTRACT

Flash type programmable nonvolatile memory unit cells are provided, along with a manufacturing method. Each unit cell is formed such that the interpoly dielectric layer and the control gate surround the top surface and also the four lateral surfaces of the floating gate. This increases the capacitance between the floating gate and the control gate, which improves a coupling ratio. This also improves electromagnetic shielding within each cell, which reduces cross talk between neighboring cells, and permits more dense integration.

11 Claims, 16 Drawing Sheets

NONVOLATIVE SEMICONDUCTOR MEMORY DEVICE WITH HIGH IMPURITY CONCENTRATION UNDER FIELD OXIDE LAYER

BACKGROUND OF THE INVENTION

1. Field of the Invention

The present invention relates to a semiconductor device and a manufacturing method thereof, and more particularly, to a nonvolatile, NAND-type flash memory and a manufacturing method thereof.

2. Description of the Related Art

Among nonvolatile memories capable of storing and erasing data electrically, a NAND-type (electrically erasable and programmable read only memory) EEPROM has a unit cell generally constructed of a laminated structure of a floating gate and a control gate.

A unit string is comprised of a string selection transistor (SSL) for selecting a bit line, a plurality of unit cells having a laminated structure of a floating gate and a control gate, a ground selection transistor (GSL) for selecting a common source line (CSL), the sources and drains of which are connected in series to a plurality of bit lines and word lines, and the common source line CSL. A plurality of unit strings are connected in parallel to the bit lines. A conventional NAND-type EEPROM was disclosed in an article entitled "A 4-Mbit NAND EEPROM with tight programmed Vt Distribution" pp. 105–106, Symposium in VLSI Circuits held in 1990.

FIG. 1 is a cross-sectional view of a conventional NAND type EEPROM cell, in the bit line direction. A n-type well 53, being of a second conductivity type, is formed on a p-type semiconductor substrate 51, which is of a first conductivity type. A p-type pocket well 55 is formed within well 53. A string selection transistor (SSL) 57 and unit cell 59 are formed on semiconductor substrate 51, on pocket well 55. An insulating layer 61 and a bit line pattern 63 are formed over SSL 57 and unit cell 59, respectively. In FIG. 1, reference numeral 65 represents the floating gate of a transistor forming a unit cell next to unit cell 59, and reference numeral 67 represents the control gate which is a word line. Reference numeral 69 represents a channel area formed in the semiconductor substrate.

FIG. 2 illustrates an equivalent circuit 76 of the NAND-type EEPROM cell and a table 78 showing its operational characteristics during programming, erasing and reading operations. In circuit 76, reference character A represents a cell selected during a programming operation, and reference character C represents a unit string.

However, according to the conventional art, insufficient field isolation between a unit cell and its neighboring unit cell, which is due to high integration of a nonvolatile memory device, results in leakage current due to a high word line voltage $V_{pgm}$ used in programming a cell. Thus, a disturbance phenomenon, also known as cross talk, where a cell (B of FIG. 2) adjacent to a selected cell (A of FIG. 2) for being programmed is also programmed, may occur.

Also, a problem appears in the manufacturing process. According to the method for forming the unit cell shown in FIG. 1, in order to prevent misalignment of the floating gate and the control gate, a self-align etching process, in which the control gate and the floating gate are simultaneously etched, is performed using the same etching mask. However, in the course of the etching process, to prevent formation of stringer by which the floating gates of adjacent cells in the bit-line direction are shorted by a field oxide layer in which polysilicon is not present, over-etching may be performed, which makes the field oxide layer thin. Although not shown in FIG. 1, the field oxide layer is formed vertically with respect to the control gate and the floating gate and parallel with the bit line. Thus, during a subsequent ion implantation process for source/drain regions, ion impurities for forming a source and a drain are implanted into the lower portion of the thinned field oxide layer, and as a result field isolation characteristics in this region are deteriorated.

Since field isolation characteristics in this region are deteriorated, electrical insulating capability from adjacent unit cells is lowered during memory device operation, thus causing malfunction of the cell.

SUMMARY OF THE INVENTION

To solve the above problems, it is an objective of the present invention to provide a programming operation by greatly improving a coupling ratio by increasing the capacitance of an interpoly dielectric layer between a floating gate and a control gate while reducing the area of the unit cell, and with a reduced thickness field oxide layer by avoiding etching loss caused by over-etching of the field oxide layer, while etching the floating gate and the control gate without misalignment.

It is another objective of the present invention to provide a NAND-type flash memory unit cell with reduced operational voltage during a programming operation by greatly improving the coupling ratio by increasing the capacitance of an interpoly dielectric layer between a floating gate and a control gate while reducing the area of a unit cell, and with a reduced thickness field oxide layer by eliminating etching loss caused by over-etching of the field oxide layer while etching the floating gate and the control gate without misalignment.

It is still another objective of the present invention to provide a method for manufacturing the NAND-type flash memory including the unit cell.

To achieve the first two objectives, flash type programmable nonvolatile memory unit cells are provided. Each unit cell is formed such that the interpoly dielectric layer and the control gate surround the top surface and also the four lateral surfaces of the floating gate. This increases the capacitance between the floating gate and the control gate, which improves a coupling ratio. This also improves electromagnetic shielding within each cell, which reduces cross talk between neighboring cells, and permits more dense integration.

More specifically, to achieve the above first objective, there is provided a programmable nonvolatile memory unit cell formed at the intersection of a bit line and a word line, including source/drain regions of a second conductivity type, formed on a semiconductor substrate of a first conductivity type on which a field oxide layer is formed, a first insulating layer formed on a channel area between the source/drain regions; a floating gate formed on the first insulating layer, a second interpoly dielectric layer surrounding the top surface of the floating gate, and four lateral surfaces in the word line and bit line directions, and a control gate surrounding the top surface and four lateral surfaces of the second interpoly dielectric layer.

To achieve the second objective, there is provided a NAND-type flash memory unit cell formed at the intersection of a bit line and a word line, including source/drain regions of a second conductivity type formed on a semiconductor substrate of a first conductivity type on which a field oxide layer is formed, a first insulating layer formed on a channel area between the source/drain regions, a floating gate formed on the first insulating layer; a second interpoly dielectric layer surrounding the top surface of the floating gate, and four lateral surfaces in the word line and bit line directions, and a control gate surrounding the top surface and four lateral surfaces of the second interpoly dielectric layer.

In both cases, the second interpoly dielectric layer may employ one-layer material, or two-layer materials comprised of a second insulating layer surrounding the top portion of the floating gate and two lateral surfaces in the bit line direction, and a third insulating layer surrounding two lateral surfaces in the word line direction.

To achieve the third objective, there is provided a method for forming a NAND-type flash memory device. A first word line pattern is first formed by depositing a first polysilicon layer, a first interpoly dielectric layer and a second polysilicon layer on a semiconductor substrate on which a field oxide layer is formed, in a vertical direction with respect to the field oxide layer and the same is patterned. A spacer insulating layer is formed on both sides of the first word line pattern. Then, a planarizing insulating layer is deposited over the entire surface of the semiconductor substrate having the spacer insulating layer and planarizing the same to expose the surface of the second polysilicon layer on the first word line pattern. The second polysilicon layer is partially etched to partially expose the first interpoly dielectric layer of the first word line pattern on the field oxide layer. The first polysilicon layer is partially exposed by partially etching the exposed first interpoly dielectric layer. The exposed first interpoly dielectric layer is partially etched and the second polysilicon layer is entirely etched. An independent floating gate is formed by etching the first interpoly dielectric layer exposed by etching the second polysilicon layer from the resultant structure, and the spacer insulating layer. A second interpoly dielectric layer is formed on top of and at four lateral surfaces of the floating gate. A second word line pattern is formed by depositing a conductive layer to be used as a control gate on the resultant structure having the second interpoly dielectric layer and the same is patterned in the word line direction.

According to a preferred embodiment, after the field oxide layer is partially exposed and the oxide layer is filled in the exposed region of the first polysilicon layer into which the first conductivity type impurity is ion-implanted, the second interpoly dielectric layer is formed, thereby improving field isolation capability.

According to the present invention, the coupling ratio is improved by increasing the capacitance of the second interpoly dielectric layer between the floating gate and the control gate, thereby reducing the operational voltage of a nonvolatile memory device. Therefore, the field isolation voltage between unit cells is reduced due to the reduced operational voltage, and the area of a unit cell is reduced by decreasing the thickness of the field oxide layer, hereby attaining high integration.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

The present invention will be described more fully hereinafter with reference to the accompanying drawings, in which preferred embodiments of the invention are shown. This invention may, however, be embodied in many different forms without departing from the spirit and essential features. For example, the p-type features can be interchanged with n-type features and vice versa.

For another example, although in the preferred embodiments programmable nonvolatile memories are described in terms of a NAND-type flash memory, they may also be implemented in terms of a NOR-type flash memory and an EEPROM unit cell. Therefore, it is to be understood that the NAND-type flash memory unit cells disclosed in the following embodiments described by way of illustration are in no way intended to be considered limiting.

The invention provides an array of flash memory unit cells. A separate description of the equivalent circuit of the NAND-type flash memory unit cells and its operational characteristics are omitted, since they are the same as those of the conventional art shown in FIG. 2.

THEORY OF THE INVENTION

Figure 1:
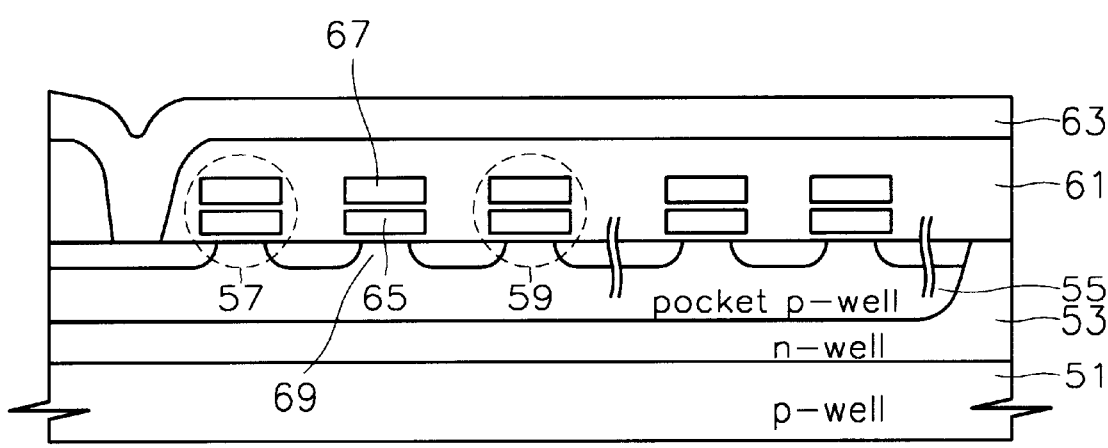
FIG. 1 is a cross-sectional view of a conventional NAND-type EEPROM cell in a bit-line direction.
Figure 3:
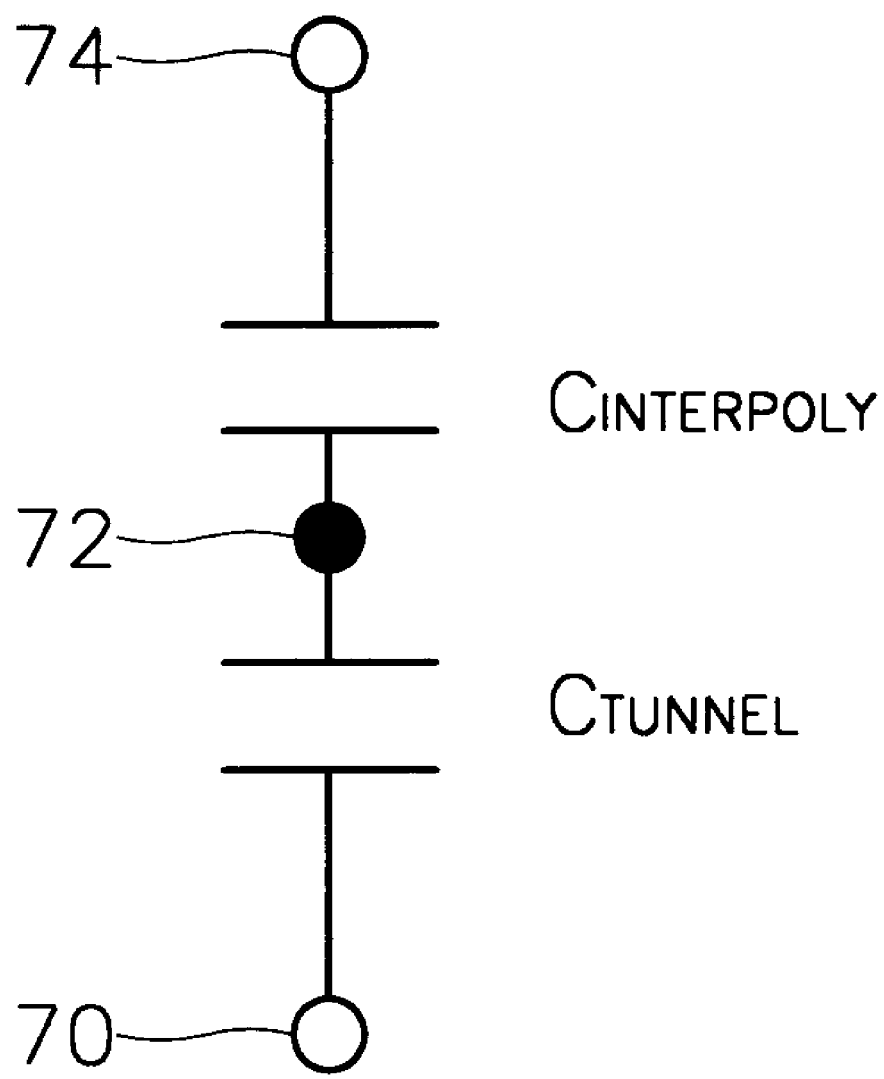
FIG. 3 is a circuit diagram for explaining the theory of the invention.

FIG. 3 is an equivalent circuit diagram for explaining the theory of the invention, as applied to the unit cell shown in FIG. 1. Tunnel oxide, also known as first insulating layer, is formed between a floating gate 65 and a channel area 69 formed on a semiconductor substrate. An interpoly dielectric layer is formed between floating gate 65 and control gate 67, which is a word line. The tunnel oxide and the interpoly dielectric layer are dielectric layers having predetermined dielectric constants. Therefore, a capacitance $C_{tunnel}$ exists between channel area 69 of the semiconductor substrate and floating gate 65, and a capacitance $C_{interpoly}$ exists between floating gate 65 and control gate 67.

The capacitances are important factors in a coupling ratio $\gamma$ for determining a voltage variation of floating gate 65 with respect to a voltage applied to control gate 67, which is a word line. Generally, coupling ratio y during a programming operation is given by:

$$\gamma = C_{interpoly}/(C_{interpoly} + C_{tunnel}) \qquad (1)$$

Figure 2:
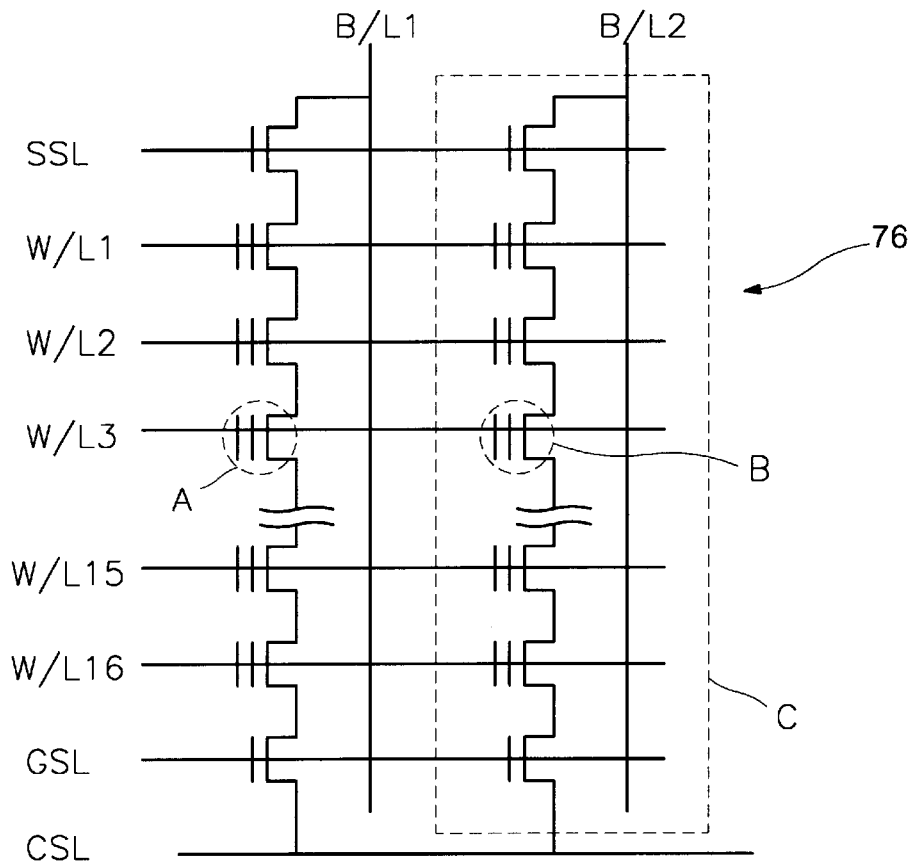
FIG. 2 illustrates an equivalent circuit of NAND-type EEPROM cells of FIG. 1, and a table showing their operational characteristics during programming, erasing and reading operations.

When a programming voltage $V_{pgm}$ is applied to the floating gate of a word line (e.g. word line W/L3 in FIG. 2)

during a programming operation, the actually measured voltage $V_{pgm}*$ on the same word line is given by:

$$V_{pgm}* = V_{pgm} \times \gamma \quad (2)$$

Accordingly, to attain high integration, it is desirable to diminish the disturbance phenomenon by reducing the required programming voltage $V_{pgm}$ as much as possible. To this end, coupling ratio γ must be increased, which is accomplished by increasing the capacitance of the interpoly dielectric layer, i.e., $C_{interpoly}$.

EMBODIMENT 1

Figure 4:
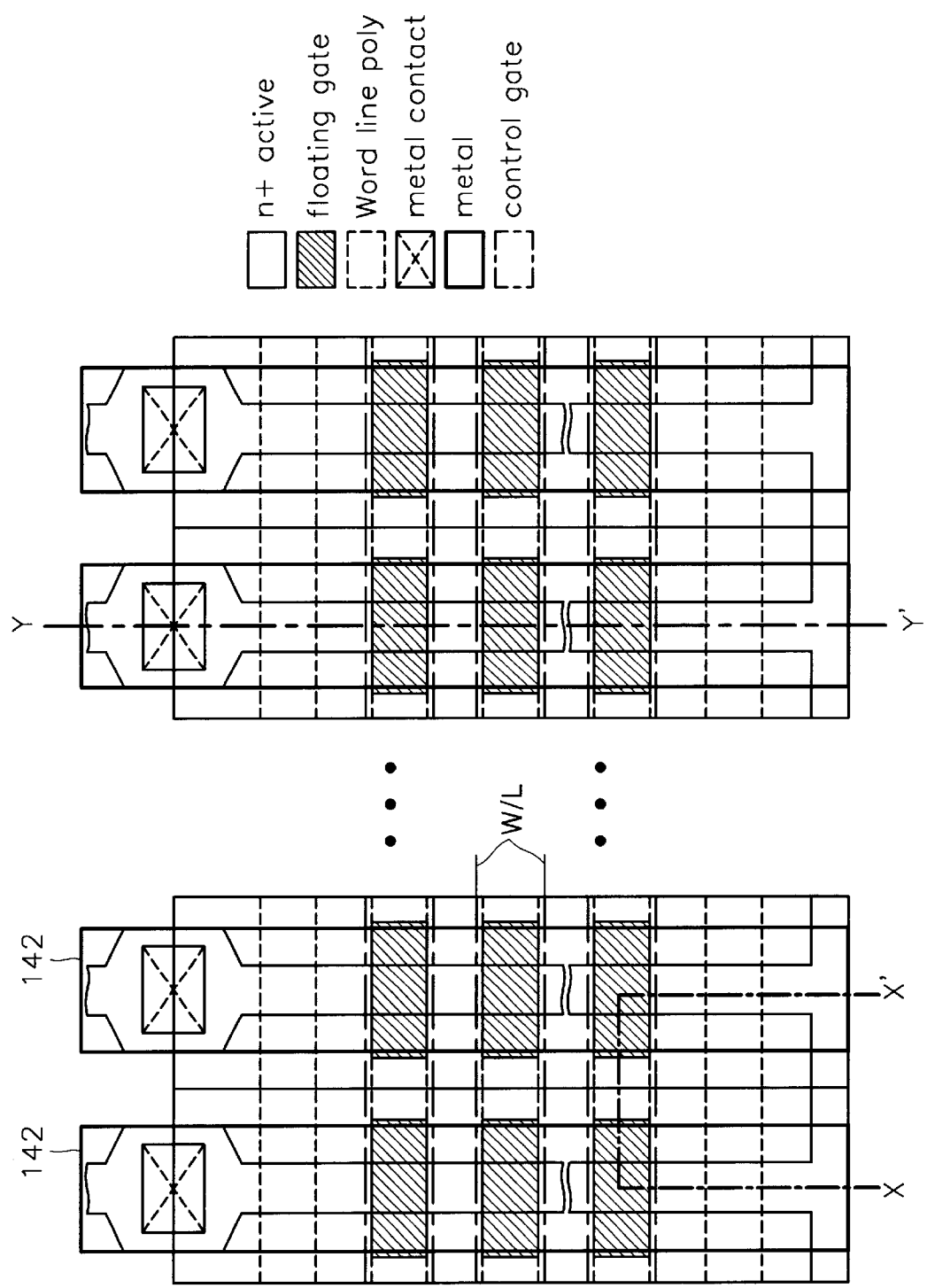
FIG. 4 is a layout diagram showing a NAND-type flash memory among nonvolatile flash memory devices according to the present invention.
Figure 5:
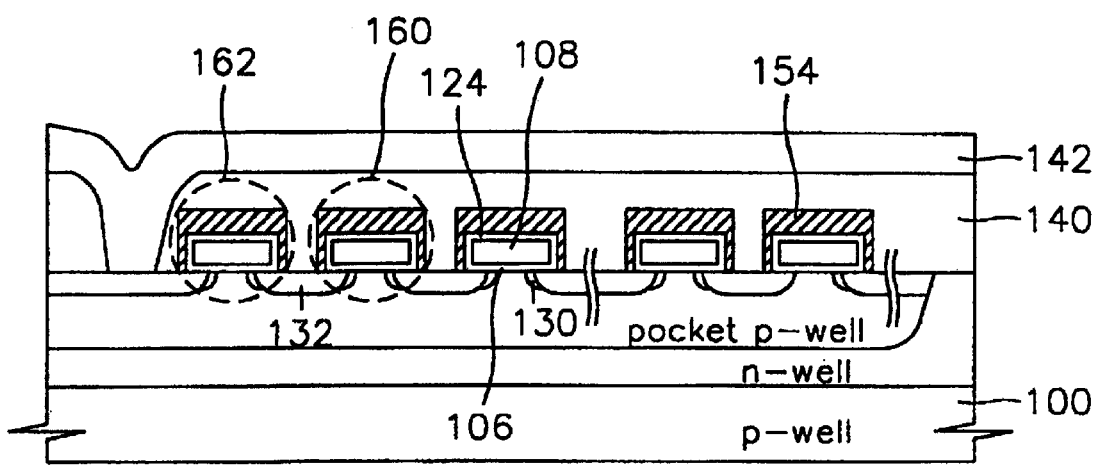
FIG. 5 is a cross-sectional view of a NAND-type flash memory unit cell according to a first embodiment of the present invention, in the bit-line direction.
Figure 6:
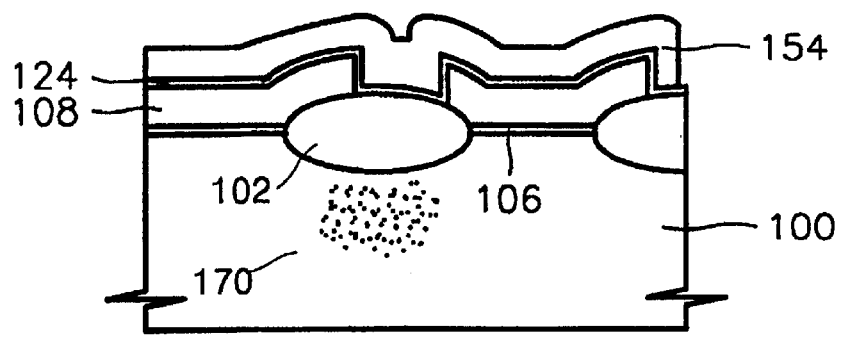
FIG. 6 is a cross-sectional view of a NAND-type flash memory unit cell according to the first embodiment of the present invention, in the word-line direction.

FIGS. 4 through 6 are diagrams for explaining a NAND-type flash memory unit cell, a type of nonvolatile memory unit cell, according to a first embodiment of the present invention.

FIG. 4 is a layout diagram illustrating a NAND-type flash memory, a type of nonvolatile flash memory according to the present invention. These unit cells are arranged in an array at intersections of a plurality of parallel bit lines with parallel word lines. The space between unit cells is preferably closer in the word-line direction than in the bit line direction.

In detail, the NAND-type flash memory is formed using different masks such that a control gate is superimposed over a floating gate at the intersection of a bit line 142 and a word line, without being self-aligned like in the conventional structure. Thus, when viewed in the bit line-direction Y–Y', the control gate surrounds the floating gate. In other words, unlike the conventional structure in which the lateral surfaces of the floating gate in the bit line direction are not surrounded by a second interpoly dielectric layer, the structure according to the present invention is surrounded by a second interpoly dielectric layer.

FIG. 5 is a cross-sectional view of a NAND-type flash memory unit cell according to a first embodiment of the present invention, taken in a bit line direction, that is, along line Y–Y' shown in FIG. 4. Reference numeral 160 represents a unit cell and reference numeral 162 represents a string selection transistor.

The NAND type flash memory unit cell according to the present invention includes source/drain regions 130 and 132 of a second conductivity type formed on a semiconductor substrate of a first conductivity type. A first insulating layer 106 is formed on a channel area between source and drain regions 130 and 132, a floating gate 108 formed on first insulating layer 106, a second interpoly dielectric layer 124 surrounding the top surface of floating gate 108 and the four sides in the directions of the word line and bit line 142. A control gate is then formed surrounding the top surface of second interpoly dielectric layer 124 preferably from all four sides. A second insulating layer 140 and bit line 142 are sequentially deposited over the unit cells.

Here, the manifest difference between the structure of the present invention and the conventional structure is that second interpoly dielectric layer 124 between floating gate 108 and control gate 154 surrounds floating gate 108 on preferably all four sides. Since first insulating layer 106 as a tunnel oxide and second interpoly dielectric layer 124 are important factors for determining the coupling ratio, the capacitance $C_{interpoly}$ described with reference to in FIG. 3 is improved by increasing the area of the second interpoly dielectric layer 124 using four sides of the floating gate, not just two sides as in the conventional case. Therefore, it is possible to set the programming voltage $V_{pgm}$ to a low level and reduce the thickness of the field oxide layer, which is necessary for attaining high integration.

FIG. 5 also serves to illustrate better why the device of the invention works well in preventing cross talk between neighboring unit cells from first principles. The lines representing electric field for each of the two capacitances are confined better for each cell, without reaching the neighboring cell. Specifically, the lines between the floating gate and the control gate are completely confined, because the control gate surrounds the floating gate. Further, the lines between the channel and the floating gate can not extend past the lateral walls of the control gate. This permits closer packing of the unit cells.

FIG. 6 is a cross-sectional view of the NAND-type flash memory unit cell according to the first embodiment of the present invention, shown in the word line direction, that is, along a middle portion of line X–X' shown in FIG. 4. The word line is perpendicular to the bit line. The word line is parallel to that section of field oxide layer 102 which is seen in FIG. 4. Thus, it is understood that four sides of floating gate 108 are all surrounded by second interpoly dielectric layer 124. Here, preferably, first insulating layer 106 is formed of an oxide layer or a silicon oxynitride layer, and the second interpoly dielectric layer is formed of an ONO (oxide/nitride/oxide) layer which is a complex layer of an oxide layer and a nitride layer.

Also, p-type impurities of a first conductivity type, such as boron, are ion-implanted into the bulk area of semiconductor substrate 100 beneath field oxide layer 102 at a dose of 1E13 ions/cm². This forms a high concentration impurity region 170 for channel stop, thereby improving field isolation capability of field oxide layer 102.

FIGS. 7 through 13 illustrate successive steps of a method for manufacturing a NAND-type flash memory unit cell according to the first embodiment of the present invention. In these drawings, direction X indicates a word line direction, and direction Y indicates a bit line direction.

Figure 7:
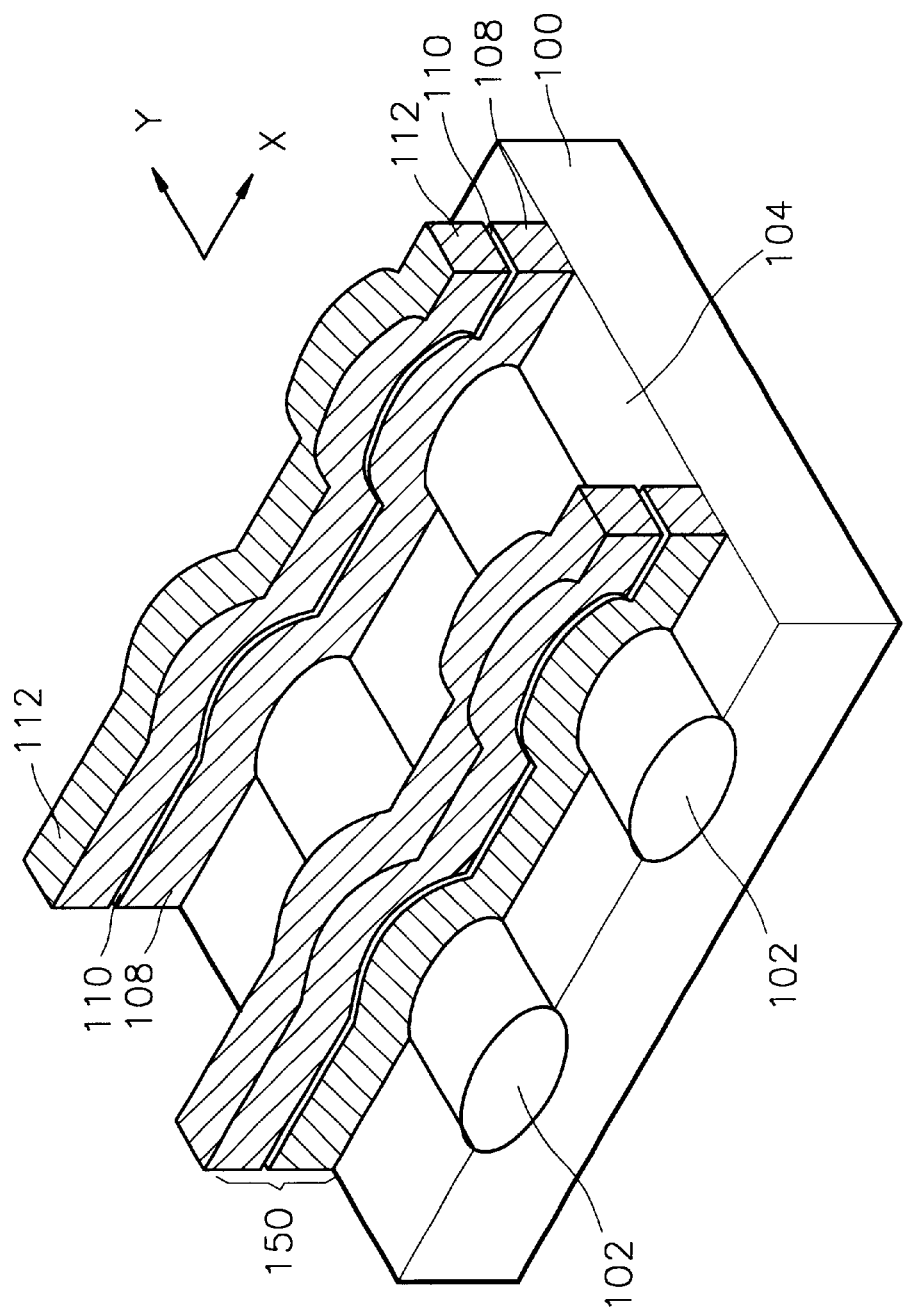
FIGS. 7, 8A, 8B, 9, 10A, 10B, 11A, 11B, 11C, 12 and 13 illustrate successive steps of a method for manufacturing the NAND-type flash memory unit cell according to the first embodiment of the present invention.

Referring to FIG. 7, a field oxide layer 102 such as LOCOS (LOCal Oxidation of Silicon) or PBL (Poly Buffered LOCOS) is formed on a p-type semiconductor substrate 100, i.e., a first conductivity type, to a thickness of 3,000 A. Subsequently, a first insulating layer (not shown), e.g., a tunnel oxide layer, is grown on an active region 104 in the form of an oxide layer (SiO₂) or silicon oxynitride layer (SiON). A first polysilicon layer 108, a first interpoly dielectric layer 110 and a second polysilicon layer 112 are deposited successively on semiconductor substrate 100, where the first insulating layer is formed to a thickness of 4,000 A, 200–1,000 A and 3,000 A, respectively. First interpoly dielectric layer 110 is preferably formed of a nitride layer (SiN) or a complex layer thereof.

Subsequently, a photolithography or etching process is carried out on the resultant structure, to pattern second polysilicon layer 112, first interpoly dielectric layer 110 and the first polysilicon layer in the lower portion thereof, thereby forming a first word line pattern 150.

Figure 8A:
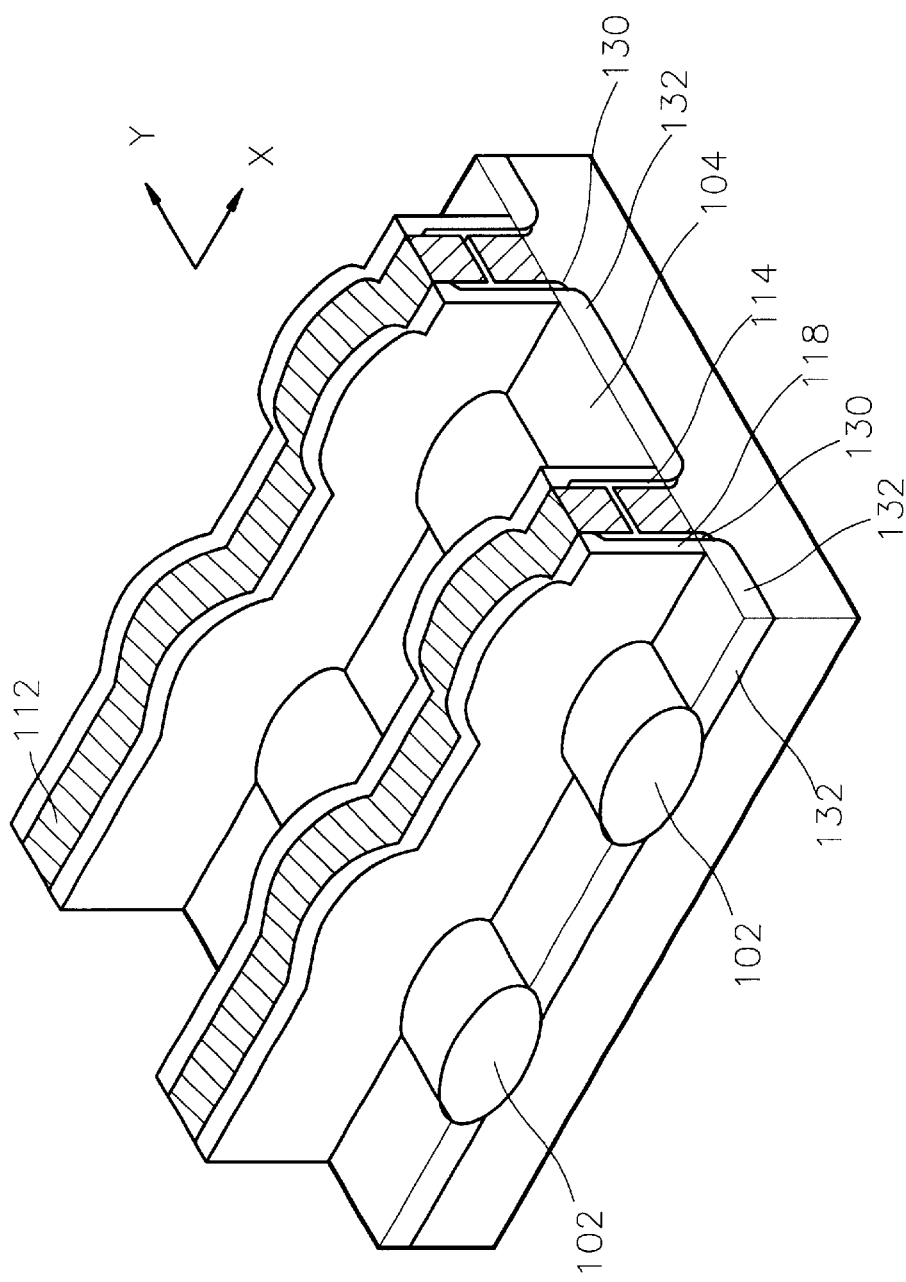

Referring to FIG. 8A, a nitride layer (SiN) as a first spacer insulating layer is deposited on the resultant structure having the first word line pattern (150 in FIG. 7) to a thickness of 100 A. Then anisotropic etching is performed thereon to form a first spacer insulating layer 114 on both lateral surfaces of the first word line pattern. Here, a nitride layer or a complex layer thereof is preferably used as first and second spacer insulating layers 114 and 118, as further explained below.

Subsequently, N-impurity of a second conductivity type is ion-implanted at a dose of 2E13 ions/cm² using the first word line pattern having first spacer insulating layer 114 as an ion implantation mask, and then annealed to form source/ drain regions having a shallow junction, that is, a lightly doped drain area (LDD) 130. Then, oxidation is performed on the semiconductor substrate between the first word line patterns to make a 300 A thick oxide layer (not shown) grow on the active region of the semiconductor substrate and beneath first spacer insulating layer 114 in the form of a bird's beak. Subsequently, a second spacer insulating layer is deposited, and then anisotropically dry-etched to form a second spacer insulating layer 118 over the first spacer insulating layer 114.

Subsequently Arsenic, an impurity of a second conductivity type, is ion-implanted at a dose of 5E15 ions/cm$^2$ using the second word line pattern having second spacer insulating layer 118 as an ion implantation mask, to form high concentration source/drain regions 132. The step of forming the high concentration source/drain regions, which is performed using the first word line pattern having second spacer insulating layer 118 as an ion implantation mask, may be omitted with respect to a unit cell region.

Figure 8B:
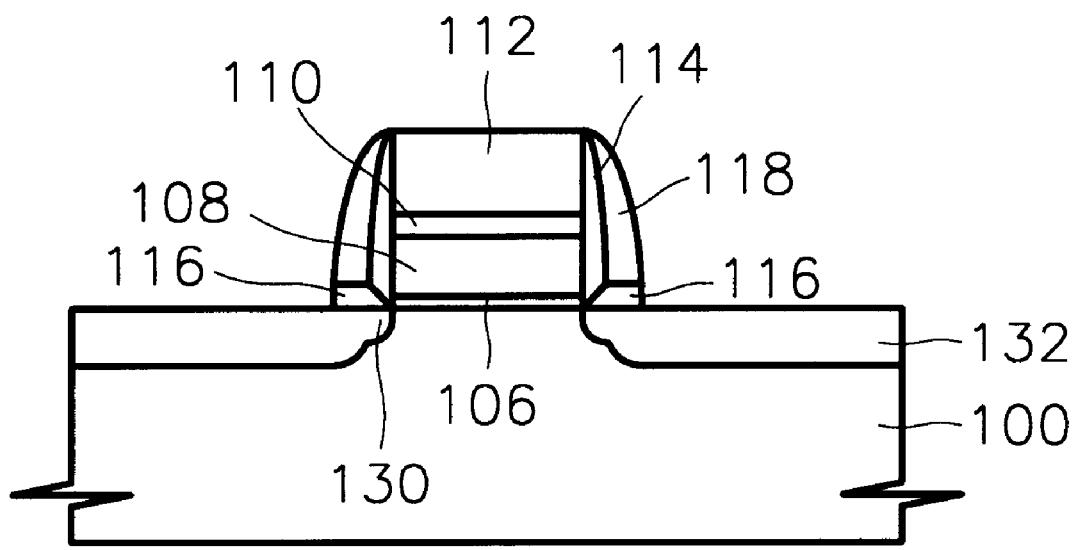

FIG. 8B is a side view of FIG. 8A, viewed from direction X, which shows that a tunnel oxide layer as first insulating layer 106, although not shown in FIGS. 7 and 8A, is formed beneath floating gate 108, and that an oxide layer 116 having a thickness of 300 A is formed on the semiconductor substrate at the lower portions of first and second spacer insulating layers 114 and 118 in the form of a bird's beak.

Figure 9:
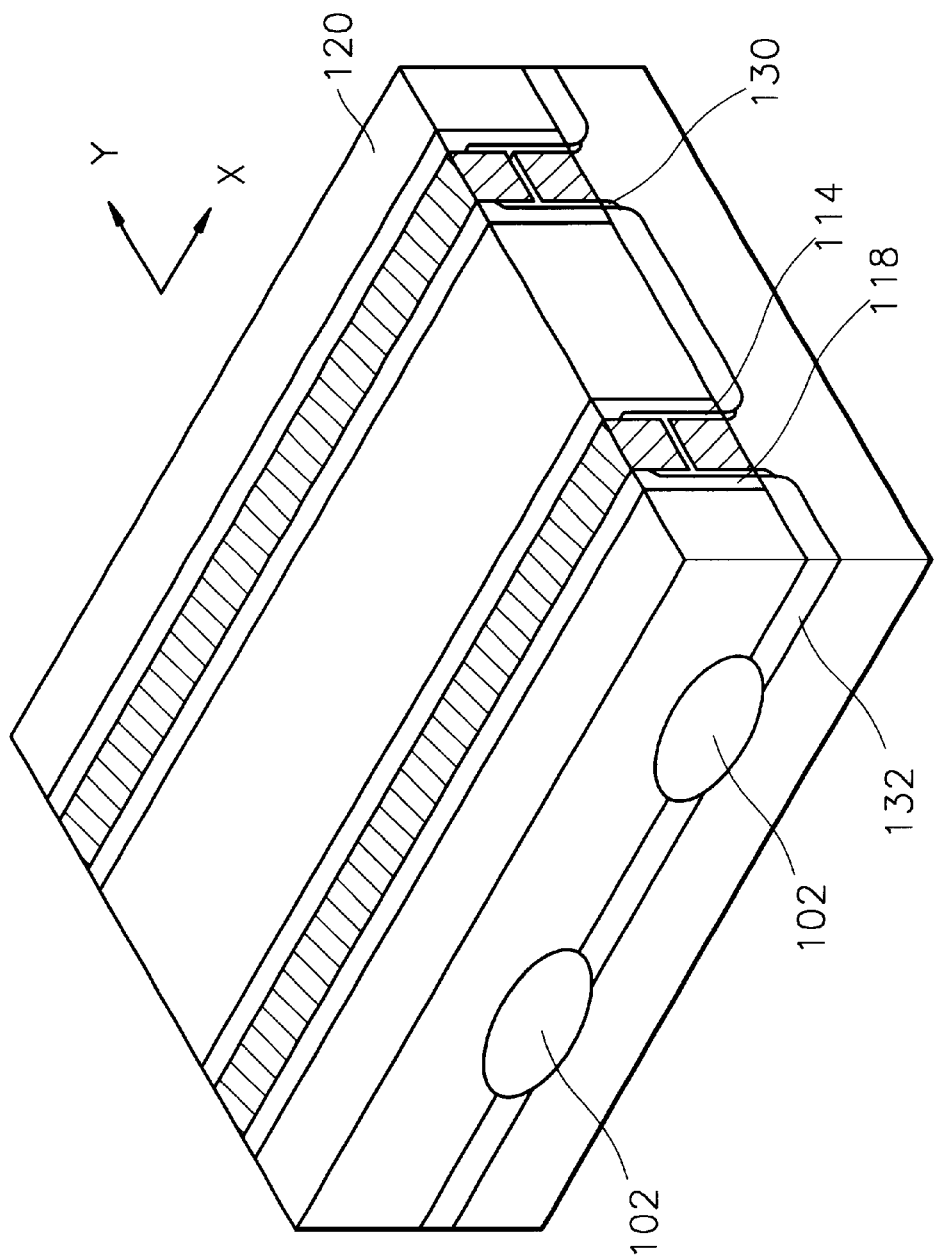

Referring to FIG. 9, an insulating layer 120 for planarization is deposited to a thickness of 8,000–12,000 A over the entire surface of the semiconductor substrate on which ion implantation of the high concentration source/drain region 132 is completely performed. Then a chemical-mechanical polishing process is performed for planarization down to the top surface of second polysilicon layer 112 on the top surface of the first word line pattern. As insulating layer 120 for planarization, undoped silicate glass (USG) and P-tetraethyl orthosilicate (P-TEOS) are deposited to thicknesses of 5,000 A and 4,000 A.

Figure 10A:
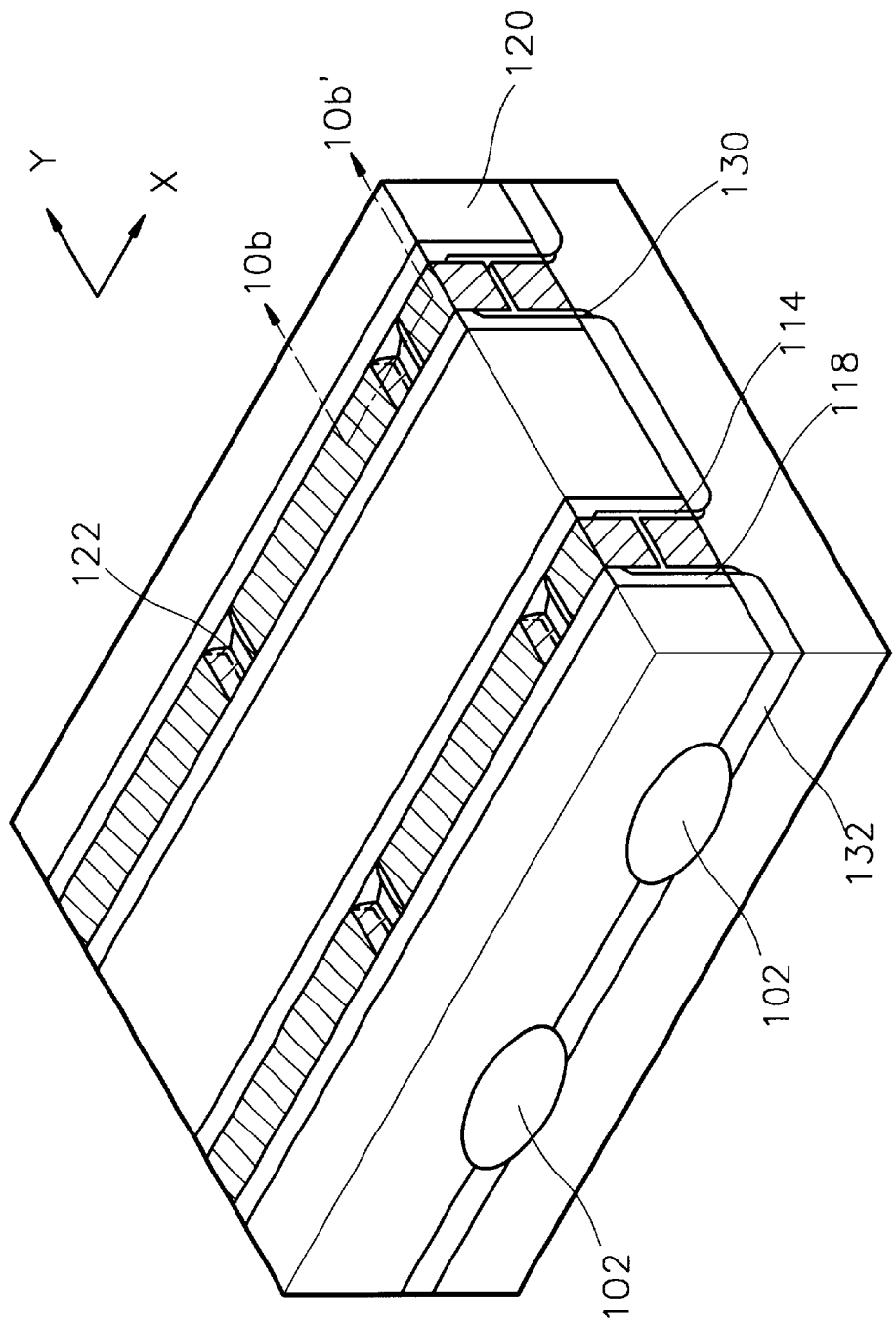

Referring to FIG. 10A, after a third polysilicon layer (not shown) is deposited over the entire surface of the semiconductor substrate on which the planarization has been performed to a thickness of 1000 A, photoresist is coated, and photolithography and etching processes are performed to partially etch the third polysilicon layer in a perpendicular direction with respect to the first word line pattern, thereby partially exposing insulating layer 120 for planarization and second polysilicon layer 112, existing on field oxide layer 102.

Subsequently the photoresist is removed, and a fourth polysilicon layer (not shown) is deposited to a thickness of 1000 A. Then anisotropic etching is performed to a spacer made of the fourth polysilicon layer at side walls of the third polysilicon layer.

Then, the exposed portion of second polysilicon layer 112 and first interpoly dielectric layer 110 are sequentially removed by dry etching. Here the third and fourth polysilicon layers existing on second polysilicon layer 112 are also etched while the exposed portion of second polysilicon layer 112 is being etched. Thus insulating layer 120 for planarization and second polysilicon layer 112 are exposed on the surface of the semiconductor substrate. Here, the spacer made of the fourth polysilicon layer serves to form a fine pattern by narrowing the gap formed by second polysilicon layer 112 etched when the exposed portion thereof is etched for removal.

Figure 10B:
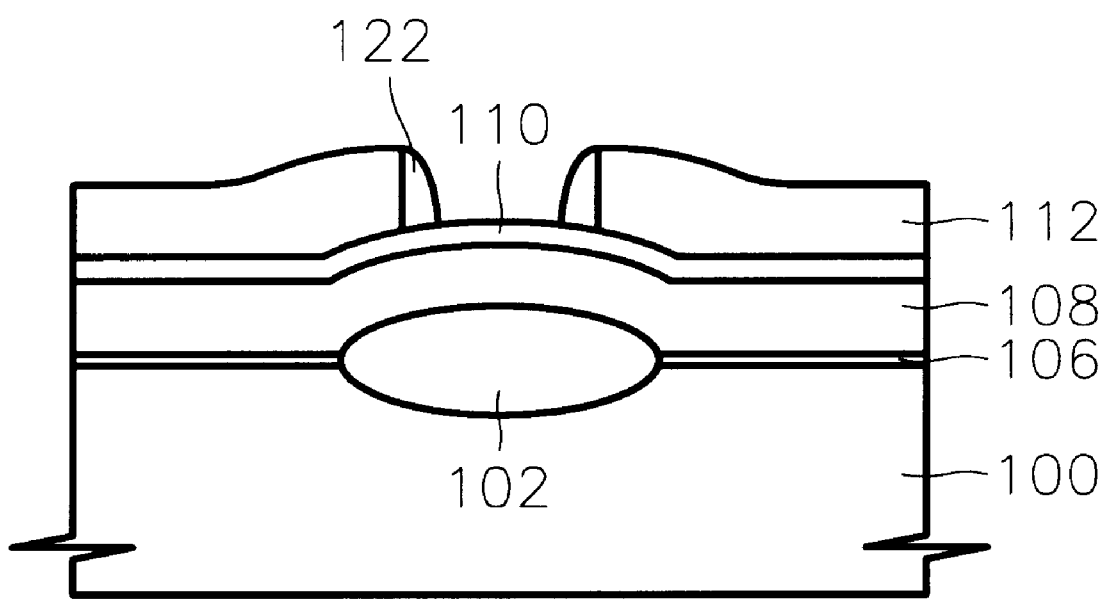

FIG. 10B is a cross-sectional view, cut away along 10b–10b' of FIG. 10A. A first polysilicon layer 108, and a first interpoly dielectric layer 110 are present on a field oxide layer 102, and second polysilicon layer 112 is partially etched. Also, the distance between the lateral surfaces of etched second polysilicon layer 112 becomes narrower by an area 122, added by formation of the spacer made of the fourth polysilicon layer.

Figure 11A:
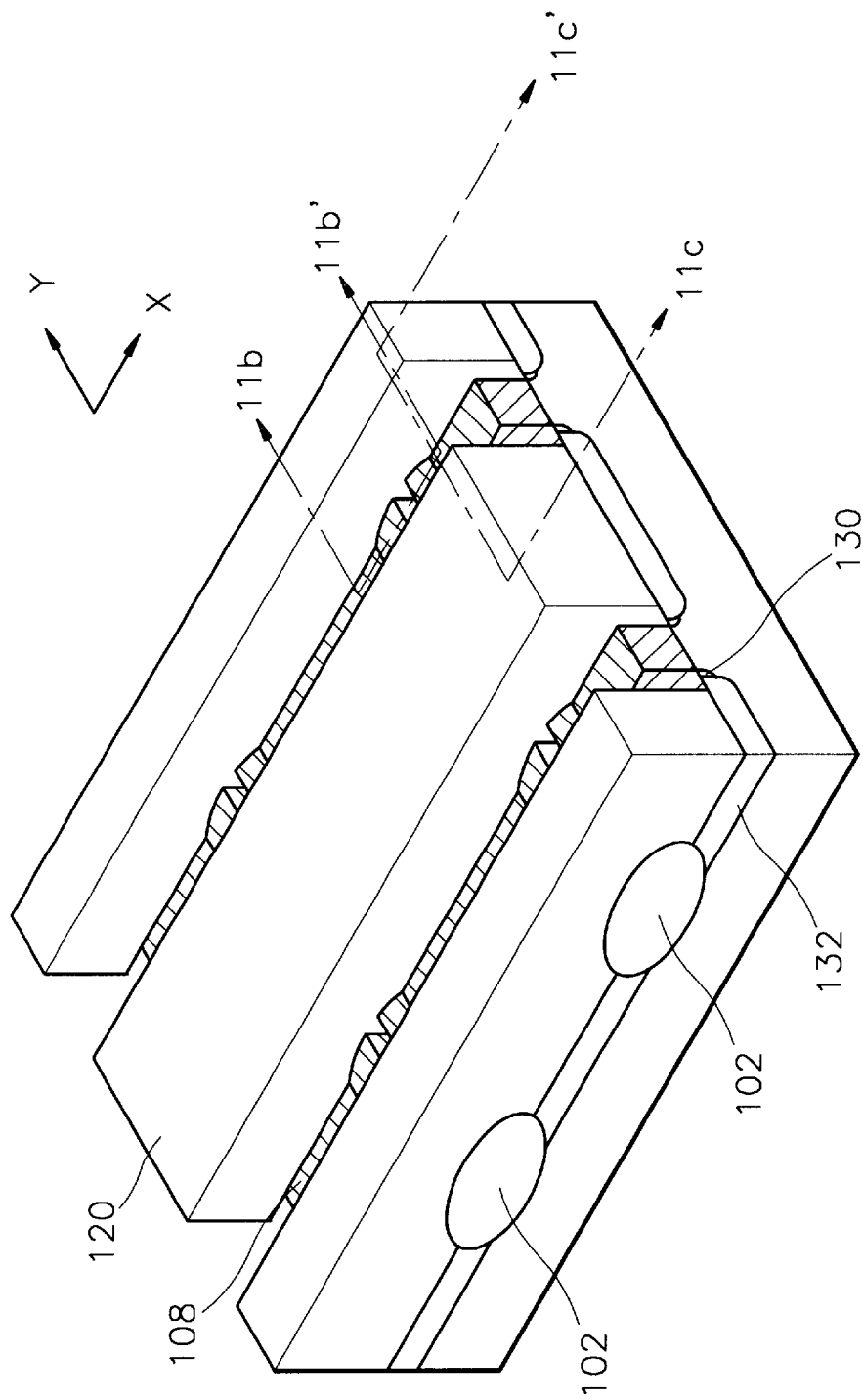

Referring to FIG. 11A, after the exposed portion of first interpoly dielectric layer 110 is partially etched, the exposed portion of first polysilicon layer 108 existing under layer 110 is etched to expose field oxide layer 102. Here, second polysilicon layer 112 with the added area 122, remaining from the first word line pattern, is completely removed, due to having a thickness less than the thickness of first polysilicon layer 108, while first polysilicon layer is etched, and then first interpoly dielectric layer 110 on the active region is exposed. In other words, while second polysilicon layer 112 and area 122 are etched, first interpoly dielectric layer 110 serves as an etching stopper to prevent first polysilicon layer 108 from being etched in the active region.

To enhance the field isolation capability of exposed field oxide layer 102, a first conductivity type impurity such as boron (B) is ion-implanted, to form a high concentration impurity region of the first conductivity type, i.e., a channel stop area, in the bulk area of semiconductor substrate 100. At this time, the ion implantation dose is preferably 1E13 ions/cm$^2$. Thus, leakage current is prevented from being generated in the field isolation area during the operation of the nonvolatile memory device. Here, first interpoly dielectric layer 110 and first polysilicon layer 108 remaining over the entire surface of the semiconductor substrate serve as a blocking layer for blocking the first conductivity type impurity from being ion-implanted into the active region. Thus, the first interpoly dielectric layer 110, made of a nitride layer or a complex layer of the same to a thickness of 200–1,000 A, may be formed to a thickness of 1,000 A or greater to enhance its capability as the blocking layer.

Subsequently, a second conductivity type impurity such as arsenic (As) or phosphorus (P) is ion-implanted into first interpoly dielectric layer 110 exposed on the active region at a dose of 1E14 ions/cm2 to implant impurity into the floating gate, i.e., first polysilicon layer 108. Subsequently, the exposed portion of first interpoly dielectric layer 110 and first and second spacer insulating layers 114 and 118 at both lateral surfaces of the first word line pattern are removed by wet etching. This exposes the top surface and four sides of the floating gate, i.e., first polysilicon layer 108. Thus, an independent floating gate 108 is formed.

Figure 11B:
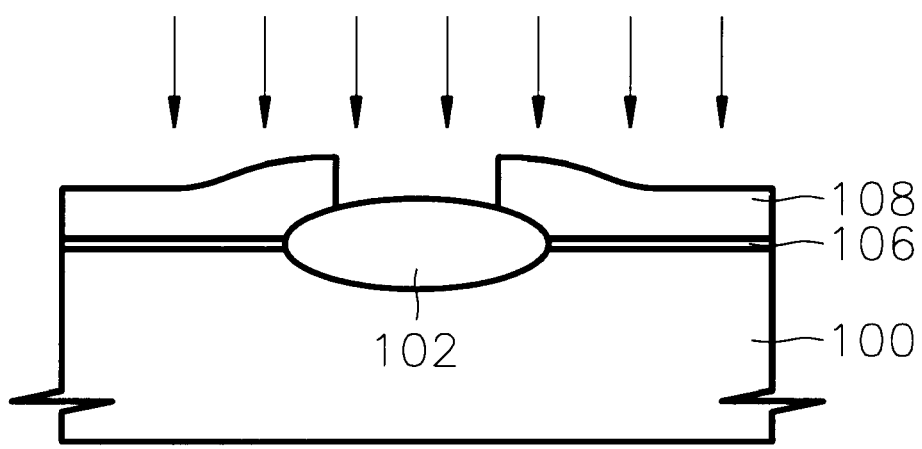

FIG. 11B is a cross-sectional view taken along line 11b–11b' shown in FIG. 11A, in which arrows are used to indicate ion implantation performed for forming a channel-stopping high concentration impurity region of a first conductivity type under the field oxide layer, and first insulating layer 106 and first polysilicon layer 108 as a floating gate are formed in the active region. Here, a first interpoly dielectric layer (not shown) on first polysilicon layer 108 is not shown in the drawing because it remains during the ion implantation process for forming the channel-stopping high concentration impurity region of the first conductivity type but is removed later.

Figure 11C:
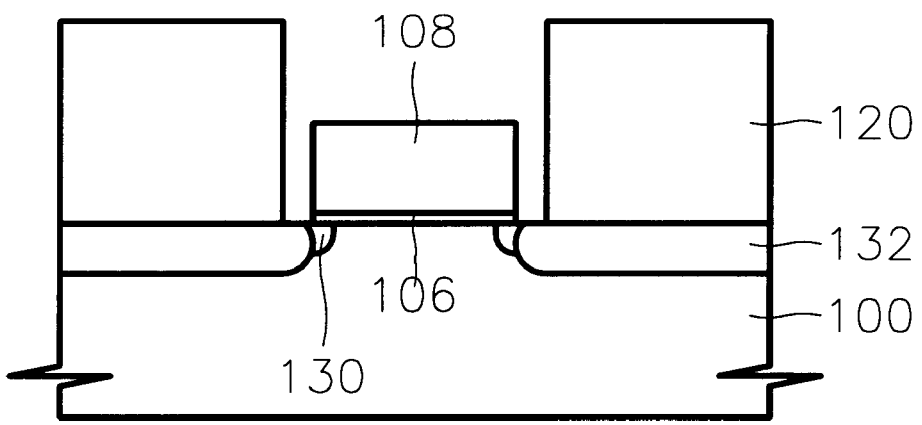

FIG. 11C is a cross-sectional view cut away along line 11c–11c' shown in FIG. 11A, from which it is understood that first interpoly dielectric layer 110 and first and second spacer insulating layers are all etched to expose the four lateral surfaces of first polysilicon layer 108 which is a floating gate. Also, planarizing insulating layer 120 is formed at either side of the floating gate.

Figure 12:
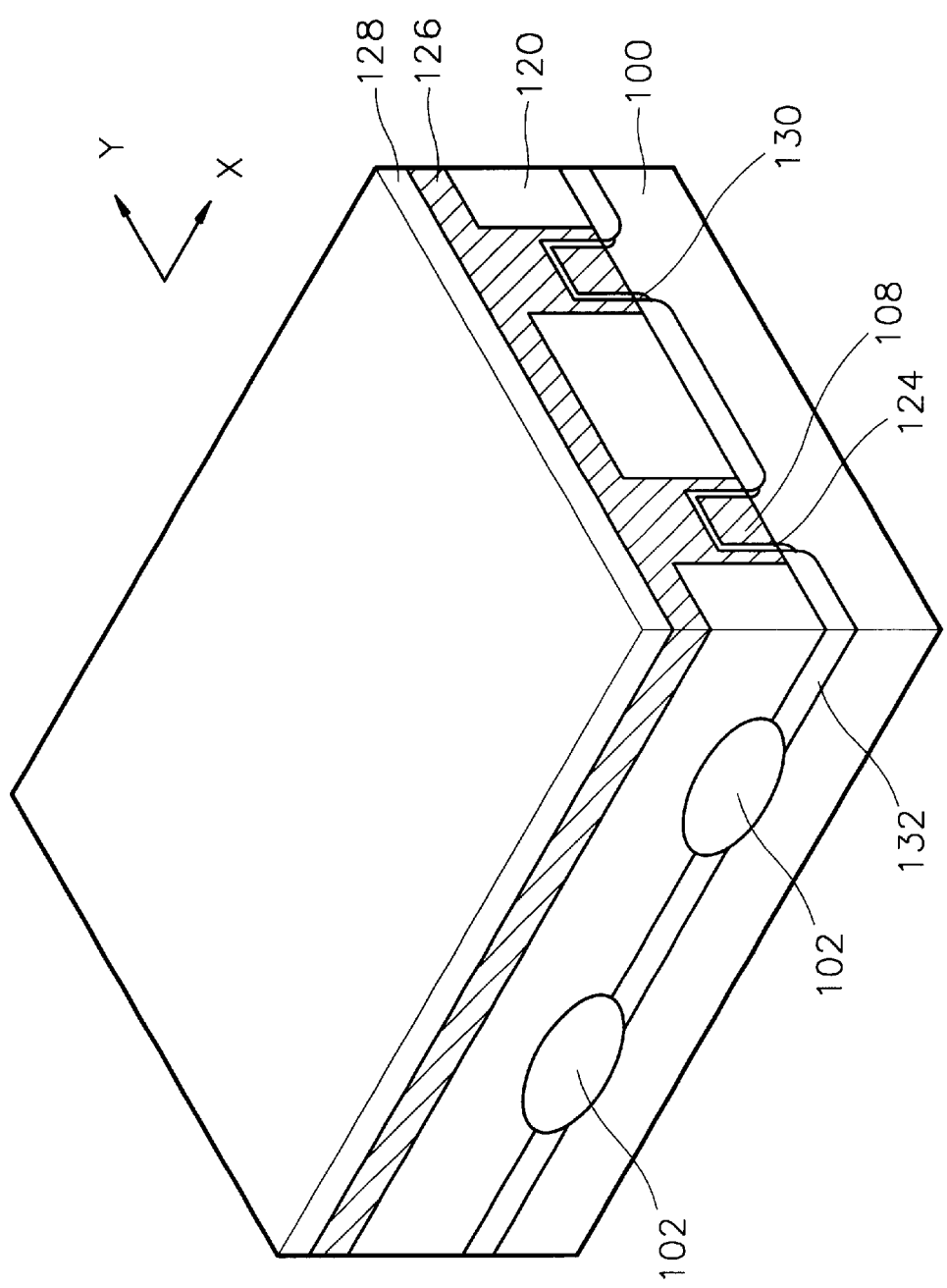

Referring to FIG. 12, a second interpoly dielectric layer 124, such as an ONO layer, is formed on first polysilicon layer 108 whose four sides are all exposed to thicknesses of 60 Å, 100 Å and 60 Å, respectively. Subsequently, a fourth polysilicon layer 126 to be used as a control gate is deposited to a thickness of 3000 Å, a planarization process, e.g., an etch-back process, is performed thereon, and then a silicide layer 128 for reducing resistance, e.g., a tungsten silicide layer (WSix) is formed to a thickness of 2000 Å.

Figure 13:
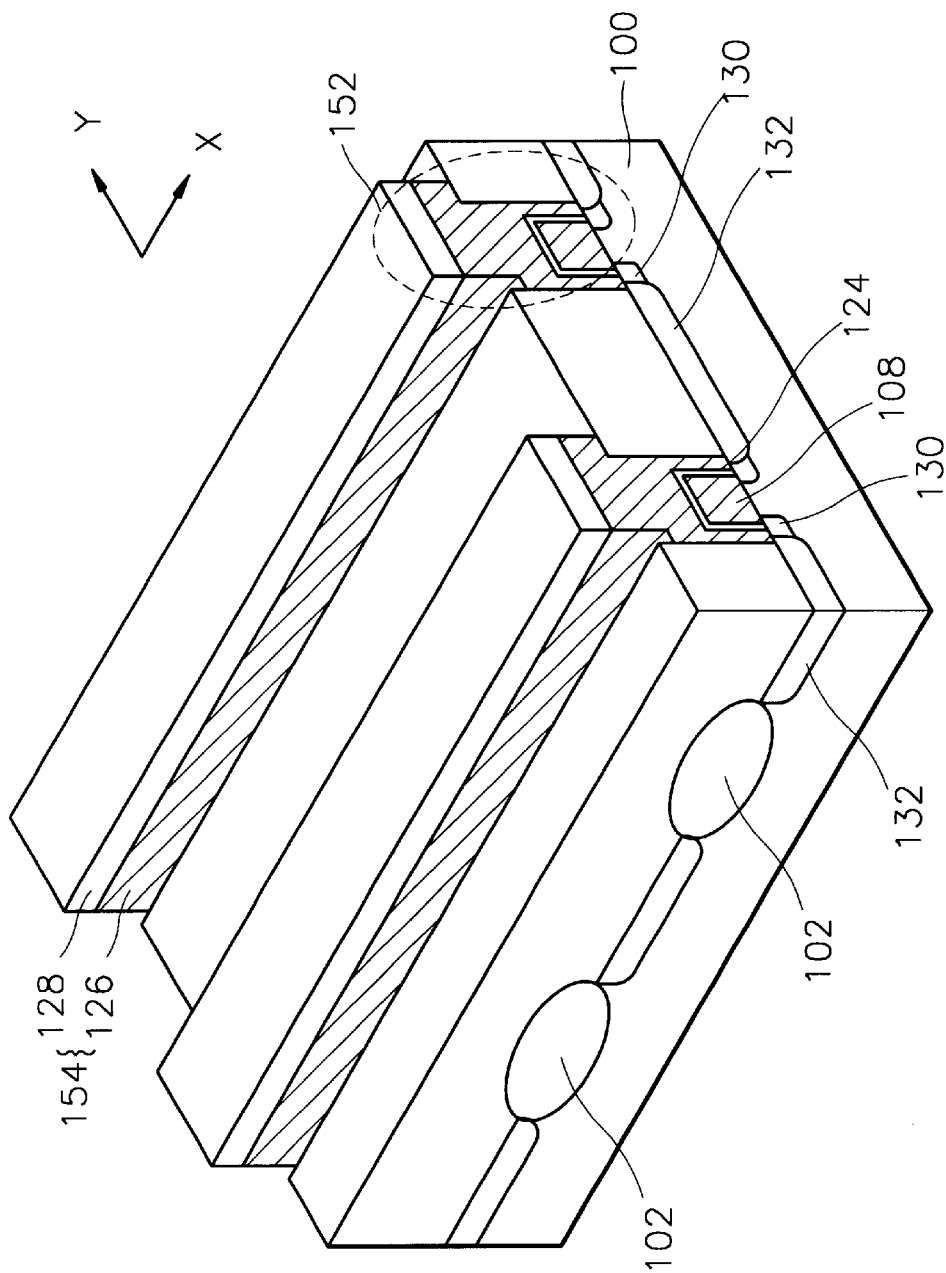

Referring to FIG. 13, photoresist is deposited over the entire surface of the semiconductor substrate on which the tungsten silicide layer is deposited, and photolithography and etching processes are performed to pattern silicide layer 128 and fourth polysilicon layer 126 in a word line direction, thereby forming a second word line pattern 152. Here, control gate 154 has a laminated structure of fourth polysilicon layer 126 and silicide layer 128.

Unlike the conventional art, in the present invention the control gate and the floating gate are etched using different masks, thereby suppressing loss due to possible overetch of second interpoly dielectric layer 124 and field oxide layer 102. Also, although misalignment occurs during etching of the floating gate and the control gate, since fourth polysilicon layer 126 surrounding the floating gate in a unit cell is thick, and the top surface and four lateral surfaces of the floating gate are surrounded by second interpoly dielectric layer 124 and control gate 154, thereby achieving self-alignment.

Thereafter, an insulating layer (140 of FIG. 5) is deposited to a thickness of several thousands of angstroms, and a contact hole is formed on the insulating layer. This completes the NAND-type flash memory device according to the first embodiment of the present invention.

EMBODIMENT 2

A nonvolatile memory unit cell or a NAND-type flash memory unit cell according to a second embodiment of the present invention is basically constructed of source/drain regions of a second conductivity type formed on a semiconductor substrate of a first conductivity type, on which a field oxide layer is formed parallel to the bit line direction and perpendicular to the word line direction, a first insulating layer formed on a channel area between the source and drain regions, a floating gate formed on the first insulating layer, a second interpoly dielectric layer surrounding the top surface of the floating gate and two lateral surfaces in the bit line direction, and a control gate surrounding the top surface and lateral surfaces of the second interpoly dielectric layer in the bit line direction and surrounding the surfaces of the second interpoly dielectric layer in the word line direction.

Figure 14:
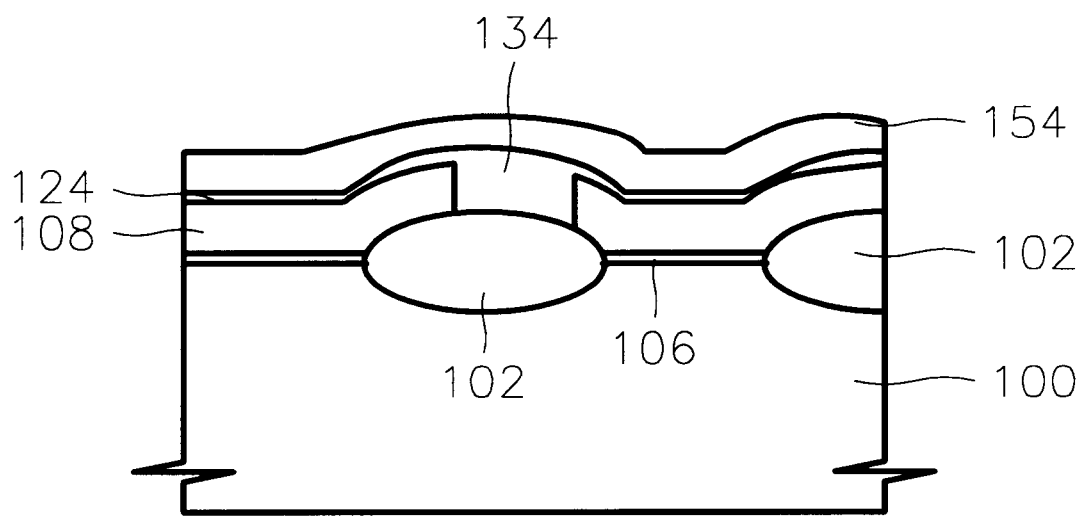
FIG. 14 is a cross-sectional view illustrating a method for manufacturing a NAND-type flash memory unit cell according to a second embodiment of the present invention.

FIG. 14 is a cross-sectional view of the NAND-type flash memory unit cell according to a second embodiment of the present invention, taken along line X–X' shown in FIG. 4.

Referring to FIG. 14, the second embodiment is different from the first embodiment in that the second interpoly dielectric layer surrounding four lateral surfaces of the floating gate is constructed such that its two lateral surfaces in the bit line direction are formed of an ONO layer and its two lateral surfaces in the word line direction are formed of an oxide layer, i.e., a third insulating layer 134, thickly, to improve device isolating capability.

In other words, the space between two floating gates 108 adjacent to each other in the word line direction is filled with the oxide layer, i.e., third insulating layer 134 on which control gate 154 is formed. This increases the thickness of field oxide layer 102, thereby increasing the threshold voltage Vt of the device isolation area. Thus, compared to the above-described first embodiment, the coupling ratio and the programming voltage can be greatly increased.

The method for forming the NAND-type flash memory unit cell according to the second embodiment of the present invention is almost the same as that according to the first embodiment, except that the third insulating layer having the same thickness as that of the first polysilicon layer is formed such that the first polysilicon layer shown in FIG. 11A is etched to expose the field oxide layer, the high concentration impurity region of the first conductivity type is formed, the oxide layer is grown or deposited on the area having the etched first polysilicon layer and an etch-back process is performed thereon. Thus, a detailed description of the method for forming the NAND-type flash memory unit cell according to the second embodiment of the present invention will be omitted herein.

As described above, according to the present invention, the capacitance of the second interpoly dielectric layer between the floating gate and the control gate is increased to improve the coupling ratio, thereby reducing the operational voltage of the nonvolatile memory device. Thus, the device isolation voltage between unit cells is reduced by the reduced operational voltage, and the area of the unit cell is reduced by decreasing the thickness of the field oxide layer, thereby attaining high integration.

The present invention is not limited to above-described embodiments and many changes and modifications may be effected by one skilled in the art without departing from the scope of the invention.

What is claimed is:

1. A NAND-type flash memory unit cell formed at the intersection of a bit line and a word line, comprising:
   source/drain regions of a second conductivity type formed on a semiconductor substrate of a first conductivity type on which a field oxide layer is formed;
   a high concentration impurity region of a first conductivity type formed on a semiconductor substrate under the field oxide layer;
   a first insulating layer formed on a channel area between the source/drain regions;
   a floating gate formed on the first insulating layer;
   a second interpoly dielectric layer surrounding the top surface of the floating gate, and four lateral surfaces in the word line and bit line directions; and
   a control gate surrounding the top surface and four lateral surfaces of the second interpoly dielectric layer.

2. An array of NAND-type flash memory unit cells formed at intersections of a plurality of bit lines and a plurality of word lines according to claim 1, wherein the distance between two cells in a word line direction is shorter than the distance between two cells in a bit line direction.

3. The NAND-type flash memory unit cell according to claim 1, wherein the source/drain regions have been formed using the floating gate as an ion implantation mask.

4. The NAND-type flash memory unit cell according to claim 1, wherein the floating gate and the control gate have been formed using different etching masks.

5. The NAND-type flash memory unit cell according to claim 1, wherein the first insulating layer is one of an oxide layer and a silicon oxynitride layer.

6. The NAND-type flash memory unit cell according to claim 1, wherein the interpoly dielectric layer is a complex layer of an oxide layer and a nitride layer.

7. A NAND-type flash memory unit cell formed at the intersection of a bit line and a word line, comprising:

source/drain regions of a second conductivity type formed on a semiconductor substrate of a first conductivity type on which a field oxide layer is formed parallel with the bit line direction and perpendicular to the word line direction;

a high concentration impurity region of a first conductivity type formed on a semiconductor substrate under the field oxide layer;

a first insulating layer formed on a channel area between the source/drain regions;

a floating gate formed on the first insulating layer;

a second intexpoly dielectric layer comprised of a second insulating layer surrounding the top surface of the floating gate and two lateral surfaces in the word line direction and a third insulating layer surrounding two lateral surfaces in the bit line direction; and a control gate surrounding the top surface and lateral surfaces of the second interpoly dielectric layer in the bit line direction and surrounding the surfaces of the second interpoly dielectric layer in the word line direction.

8. The NAND-type flash memory unit cell according to claim 7, wherein the floating gate and the control gate have been formed using different etching masks.

9. The NAND-type flash memory unit cell according to claim 7, wherein the interpoly dielectric layer is a complex layer of an oxide layer and a nitride layer.

10. An array of NAND-type flash memory unit cells formed at intersections of a plurality of bit lines and a plurality of word lines according to claim 7, wherein a thickness of third the insulating layer between neighboring floating gates is the same as that of the floating gate on the field oxide layer.

11. The NAND-type flash memory unit cell according to claim 7, wherein the third insulating layer is an oxide layer.

* * * * *

UNITED STATES PATENT AND TRADEMARK OFFICE
CERTIFICATE OF CORRECTION

PATENT NO. : 6,417,538 B1
DATED : July 9, 2002
INVENTOR(S) : Choi

It is certified that error appears in the above-identified patent and that said Letters Patent is hereby corrected as shown below:

<u>Title page, Item [54] and Column 1, Line 1,</u>
In the Title "NONVOLATIVE" should read -- NONVOLATILE --.

<u>Column 2,</u>
Line 18, "provide a programming" should read -- provide a programmable nonvolatile memory unit cell with reduced operational voltage during a programming --.

<u>Column 3,</u>
Line 56, "hereby" should read -- thereby --.

<u>Column 4,</u>
Line 62, "y" should read -- $\gamma$ --.

<u>Column 11,</u>
Line 12, "intexpoly" should read -- interpoly --

<u>Column 12,</u>
Lines 5-6, "have been formed" should read -- are formed --.

Signed and Sealed this

Seventeenth Day of December, 2002

JAMES E. ROGAN
*Director of the United States Patent and Trademark Office*